United States Patent [19]
Matsumiya

[11] Patent Number: 5,367,480
[45] Date of Patent: Nov. 22, 1994

[54] SEMICONDUCTOR MEMORY

[75] Inventor: Masato Matsumiya, Kawasaki, Japan

[73] Assignee: Fujitsu Limited, Kawasaki, Japan

[21] Appl. No.: 945,925

[22] Filed: Sep. 17, 1992

[30] Foreign Application Priority Data

Sep. 20, 1991 [JP] Japan .................. 3-241054

[51] Int. Cl.$^5$ .............................................. G11C 5/06
[52] U.S. Cl. ............................................. 365/63; 365/51
[58] Field of Search ............... 365/63, 51, 154, 230.05

[56] References Cited

U.S. PATENT DOCUMENTS

| | | | |
|---|---|---|---|
| 4,535,423 | 8/1985 | Nozaki | 365/63 |
| 4,541,076 | 9/1985 | Bowers | 365/230.05 |
| 4,649,516 | 3/1987 | Chung | 365/230.05 |
| 4,791,607 | 12/1988 | Igarashi | 365/63 |
| 5,161,124 | 11/1992 | Love | 365/63 |

FOREIGN PATENT DOCUMENTS 61-34792 2/1986 Japan .
1-119987 5/1989 Japan .

*Primary Examiner*—Eugene R. LaRoche
*Assistant Examiner*—A. Zarabian
*Attorney, Agent, or Firm*—Staas & Halsey

[57] ABSTRACT

A semiconductor memory, such as a static random access memory (SRAM), utilizes short data buses to improve operation speed. The semiconductor memory includes a first group of output ports for receiving data through a first set of bit line pairs, a first data fetching gate and a first data bus for the first set of bit line pairs, disposed along a first long side, a second group of output ports for receiving data through a second set of bit line pairs, and a second data fetching gate and a second data bus for the second set of bit line pairs, disposed along a second long side.

15 Claims, 8 Drawing Sheets

SEMICONDUCTOR MEMORY

BACKGROUND OF THE INVENTION

1. Field of the Invention

The present invention relates to a semiconductor memory such as an SRAM (static random access memory) having flip-flop memory cells.

2. Description of the Related Art

FIG. 1 is a plan view schematically showing a conventional SRAM. Numeral 1 denotes a chip proper, 2 an array of memory cells, 3 a bit line pair, 4 a data fetching gate, 5 a data bus, and 60 to 63 output ports (pads). The data bus 5 for bit pairs is connected to output circuits (not shown) corresponding to the output ports 60 to 63. Other pads such as power source pads, are omitted in the figure.

This conventional SRAM is based on DIP (dual in-line package) pin arrangement standards of JEDEC (Joint Electronic Device Engineering Council). The bit line pairs 3 extend in parallel with short sides 7 and 8 of an element forming a plane of the chip 1. The output ports 60 and 61 are disposed along the short side 7 in the vicinity of a long side 9, while the output ports 62 and 63 are disposed along the short side 7 in the vicinity of another long side 10.

Since the storage capacity of this conventional SRAM is not so large, the chip area thereof is not so wide and the output ports 60 and 61 are not so distanced away from the output ports 62 and 63.

In recent years, however, storage capacities of SRAMs are increasing, thereby increasing chip areas and widening distances between output ports. These factors result in elongating data buses, which hinder high-speed operation of the SRAMs.

SUMMARY OF THE INVENTION

An object of the invention is to provide a semiconductor memory such as an SRAM, having short data buses to realize high-speed operation.

In order to accomplish the object, a semiconductor memory according to the invention basically comprises a bit line region including a plurality of bit line pairs extending in parallel with one another in a first direction on an element forming plane of a semiconductor chip, two wiring groups extending in parallel with each other in a second direction that is orthogonal to the first direction, each wiring group having at least a data fetching gate and a data bus and at least two ports selected from output, input, and input/output ports, and disposed adjacent to the wiring groups, respectively.

This semiconductor memory includes memory cells arranged in rows and columns with the columns of the memory cells being in parallel with a first side of the element forming plane of the semiconductor chip. The bit line pairs are in parallel with the first side. At least one of the output, input, and input/output ports is arranged along the first side in the vicinity of each of second and third sides that are orthogonal to the first side.

Alternatively, at least one of the output, input, and input/output ports may be arranged at the center of each of the second and third sides.

In this way, unlike the prior art that employs a single wiring group, the invention disposes at least two separate wiring groups at two different locations, respectively, with each wiring group including at least a data bus and a data fetching gate. Due to this arrangement, the semiconductor memory of the invention achieves high-speed operation and prevents malfunctions caused by noise.

DETAILED DESCRIPTION OF THE INVENTION

SRAMs according to the first to fourth embodiments of the invention will be explained with reference to FIGS. 2 to 7.

Figure 1:
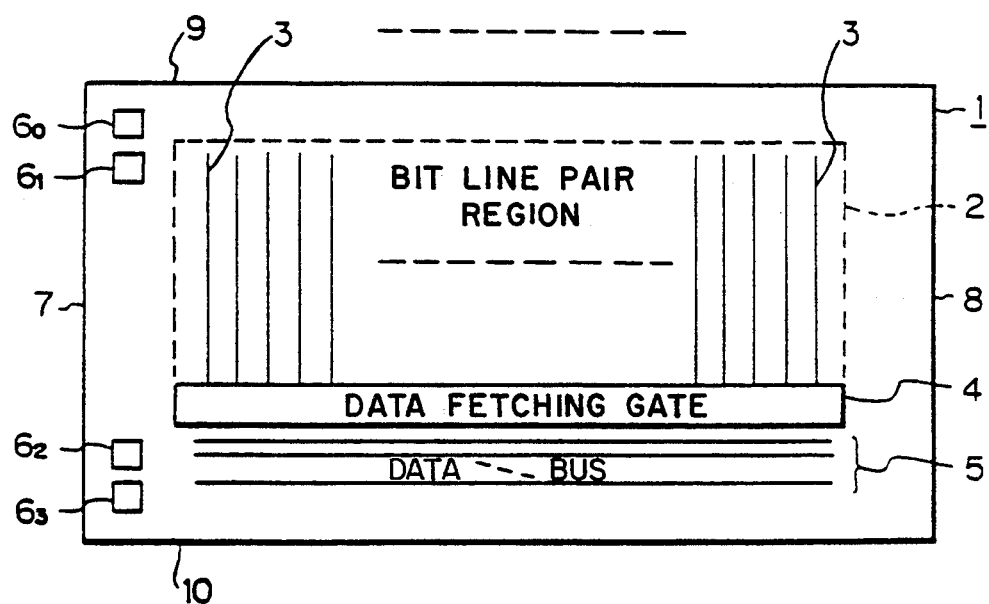
FIG. 1 is a plan view schematically showing an SRAM according to a prior art.
Figure 2:
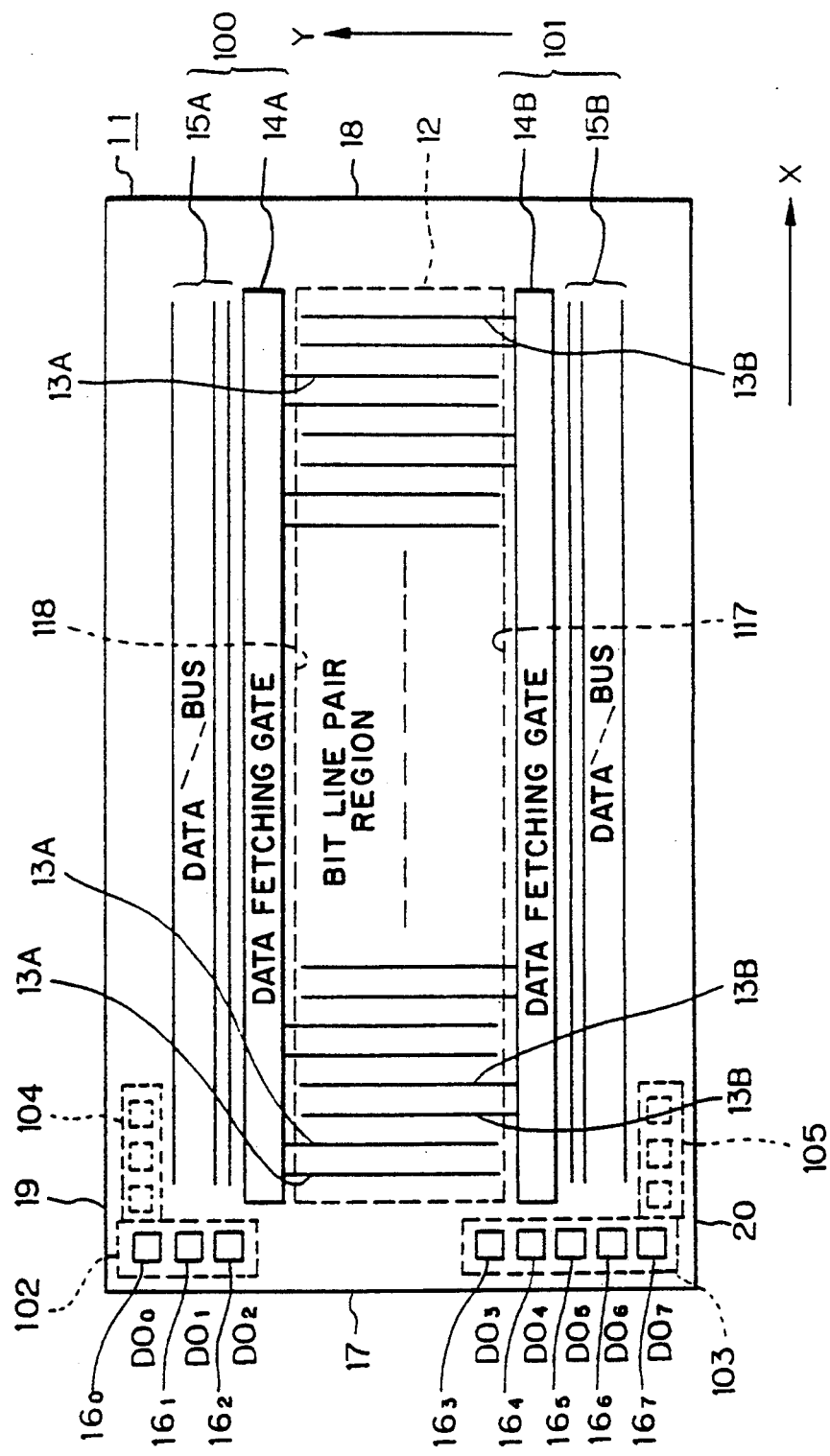
FIG. 2 is a plan view schematically showing a first embodiment of the invention.

FIG. 2 is a plan view schematically showing the first embodiment of the invention. This embodiment is based on the pin arrangement standards of JEDEC shown in FIG. 3.

Figure 3:
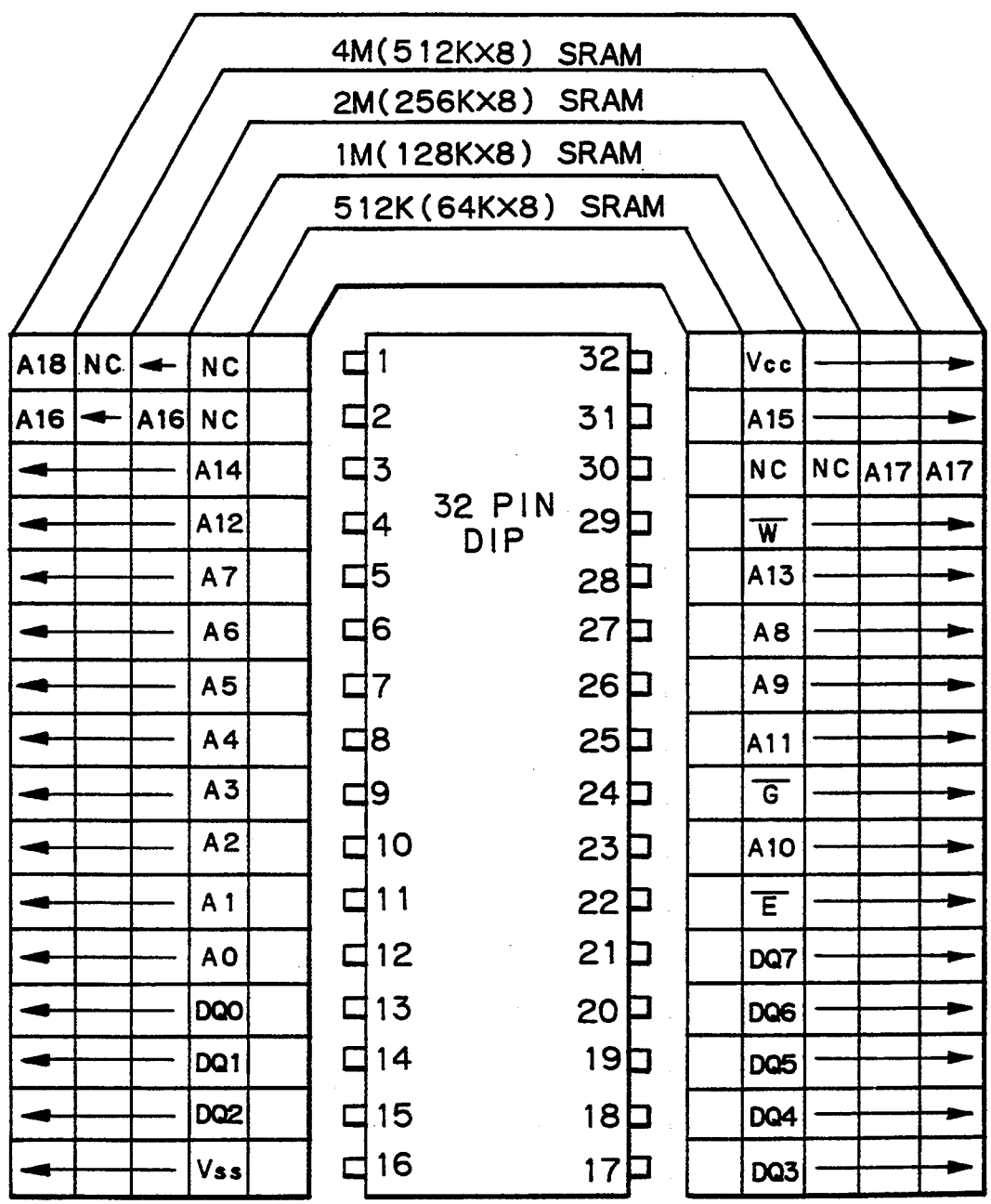
FIG. 3 is a view showing pin arrangement standards.

In FIG. 3, a reference mark Vcc denotes a high voltage source, Vss a low voltage source, A0 to A18 addresses, DQ0 to DQ7 data, /W a write enable signal, /E a chip selection signal, /G an out enable signal, and NC denotes no connection.

In FIG. 2, numeral 11 denotes a chip proper, 12 a bit line pair region containing an array of memory cells, 13A and 13B bit line pairs, 14A and 14B data fetching gates, 15A and 15B data buses, and 160 to 167 input/output ports. Pads, such as power source pads, are omitted in the figure.

The bit line pairs 13A transfer data of the memory cells to the input/output ports 160 to 162, and the bit line pairs 13B transfer data of the memory cells to the input/output ports 163 to 167.

In this way, the bit line pairs 13A and 13B disposed in the bit line pair region 12 are arranged in parallel with one another in a first direction indicated with an arrow mark Y on an element forming plane of the semiconductor chip 11. At least two wiring groups 100 and 101 are disposed in parallel with each other in a second direction indicated with an arrow mark X. The second (X) direction is orthogonal to the first (Y) direction.

The two wiring groups 100 and 101 are on each side of the bit line pair region 12 respectively. Each of the wiring groups 100 and 101 includes at least a data fetching gate (14A, 14B) and a data bus (15A, 15B). At least two ports (160 to 16n) selected from the output, input, and input/output ports are disposed close to the wiring groups 100 and 101, respectively.

According to the invention, some (13A) of the bit line pairs in the bit line pair region 12 are connected to the first wiring group 100 and the others (13B) are connected to the second wiring group 101.

According to the first embodiment, each of the ports 160 to 16n is any one of input, output, and input/output ports. These ports may be optionally combined.

Namely, the ports 160 to 16n may be all output ports, input ports, or input/output ports, or a combination thereof.

According to the first embodiment, the ports 160 to 16n are allocated for the first and second wiring groups 100 and 101. Namely, as shown in FIG. 2, at least one of output, input, and input/output ports is arranged in the vicinity of each of the wiring groups 100 and 101, respectively, along at least one of opposing peripheral edges 17 and 18 outside the bit line region 12. The edges 17 and 18 are oriented in the first (Y) direction.

The number of ports arranged in the vicinity of the first wiring group 100 and the number of ports arranged in the vicinity of the second wiring group 101 are determined according to a ratio of the number of the bit line pairs 13A connected to the first wiring group 100 to the number of the bit line pairs 13B connected to the second wiring group 101.

Among the ports selected from the input, output, and input/output ports, a first group of the ports (160 to 162) are arranged in a region 102. This region 102 is formed on the element forming plane of the chip 11, located close to the first wiring group 100, and extends along the side 17 oriented in the first (Y) direction beside the bit line pair region 12. On the other hand, a second group of ports (163 to 167) are arranged in a region 103, which is close to the second wiring group 101.

Alternatively, the port groups may be arranged in regions 104 and 105, respectively. The regions 104 and 105 are oriented in the second (X) direction and extend parallel to the wiring groups 100 and 101, respectively, as indicated with dotted lines in FIG. 2.

The bit line pairs 13A and 13B are partly alternately arranged, so that a ratio of the number of the bit line pairs 13A to the number of the bit line pairs 13B will be 3 to 5.

The data fetching gate 14A and data bus 15A are for the bit line pairs 13A, and the data fetching gate 14B and data bus 15B are for the bit line pairs 13B.

In this way, the bit line pairs 13A and 13B are arranged in parallel with the short sides 17 and 18 on the element forming plane of the chip 11. The output ports 160 to 162 are arranged along the short side 17 in the vicinity of the long side 19, and the output ports 163 to 167 are arranged along the short side 17 in the vicinity of the long side 20.

The data fetching gate 14A and data bus 15A, for transferring data from the memory cells to the output ports 160 to 162 through the bit line pairs 13A, are arranged along the long side 19, with the data bus 15A for bit pairs being connected to output circuits (not shown) corresponding to the output ports 160 to 162.

On the other hand, the data fetching gate 14B and data bus 15B, for transferring data from the memory cells to the output ports 163 to 167 through the bit line pairs 13B, are arranged along the long side 20, with the data bus 15B for bit pairs being connected to output circuits (not shown) corresponding to the output ports 163 to 167.

Even if the area of the chip 11 is increased to widen a distance between a group of the output ports 160 to 162 and a group of the output ports 163 to 167, the data buses 15A and 15B will not be extended. This results in high-speed operation.

Although the first embodiment employs the two data fetching gates 14A and 14B, they will never cause deterioration of the operation speed because these gates are driven by digital drive circuits that operate at high speed.

The distance from the output ports 160 to 162 to the output ports 163 to 167 is preferred to be longer than half the length of one bit line 13A (13B). This will result in not extending the data buses 15A and 15B too long.

Namely, at least one port arranged in the vicinity of the first wiring group is preferably separated from at least one port arranged in the vicinity of the second wiring group by half of the length of one bit line disposed in the bit line pair region.

The semiconductor memory according to the first embodiment may be a static random access memory including, for example, flip-flop memory cells.

The ports 160 to 162 of FIG. 2 disposed in the region 102 in the vicinity of the first wiring group 100 correspond to pin positions DQ0 to DQ2 of the international standards of FIG. 3. On the other hand, the ports 163 to 167 of FIG. 2 disposed in the region 103 in the vicinity of the second wiring group 101 correspond to the pin positions DQ3 to DQ7 of FIG. 3.

As explained above, a semiconductor memory according to the invention comprises a bit line pair region including a plurality of bit line pairs arranged in parallel with one another in a first direction on an element forming plane of a semiconductor chip, two wiring groups arranged on each side of the bit line pair region, respectively and oriented in a second direction that is orthogonal to the first direction, each of the wiring groups including at least a data fetching gate and a data bus and at least one port selected the from output, input, and input/output ports and disposed in the vicinity of each of the wiring groups.

This arrangement is based on the international standards that prefer input/output ports to be separately laid out, and this arrangement is advantageous in shortening connection wiring between the ports and the bit line pairs, minimizing the semiconductor chip, and improving the integration of the chip.

According to the semiconductor memory of the invention, signal information may be individually fetched from each bit line pair through the first or second wiring group. It is also possible to group the bit line pairs, and fetch signal information from each group of bit line pairs through a corresponding one of the wiring groups. In this case, the bit line pairs can be optionally combined and patterned to greatly reduce the number of direct wiring connections to the ports, minimize wiring load, and reduce power consumption.

According to the semiconductor memory of the invention, the bit line pairs are divided into two groups and connected to the first and second wiring groups, respectively, to separately fetch signal information through these wiring groups. In this case, it is necessary to correctly fetch signal information from the respective bit line pairs in a predetermined order.

Figure 8:
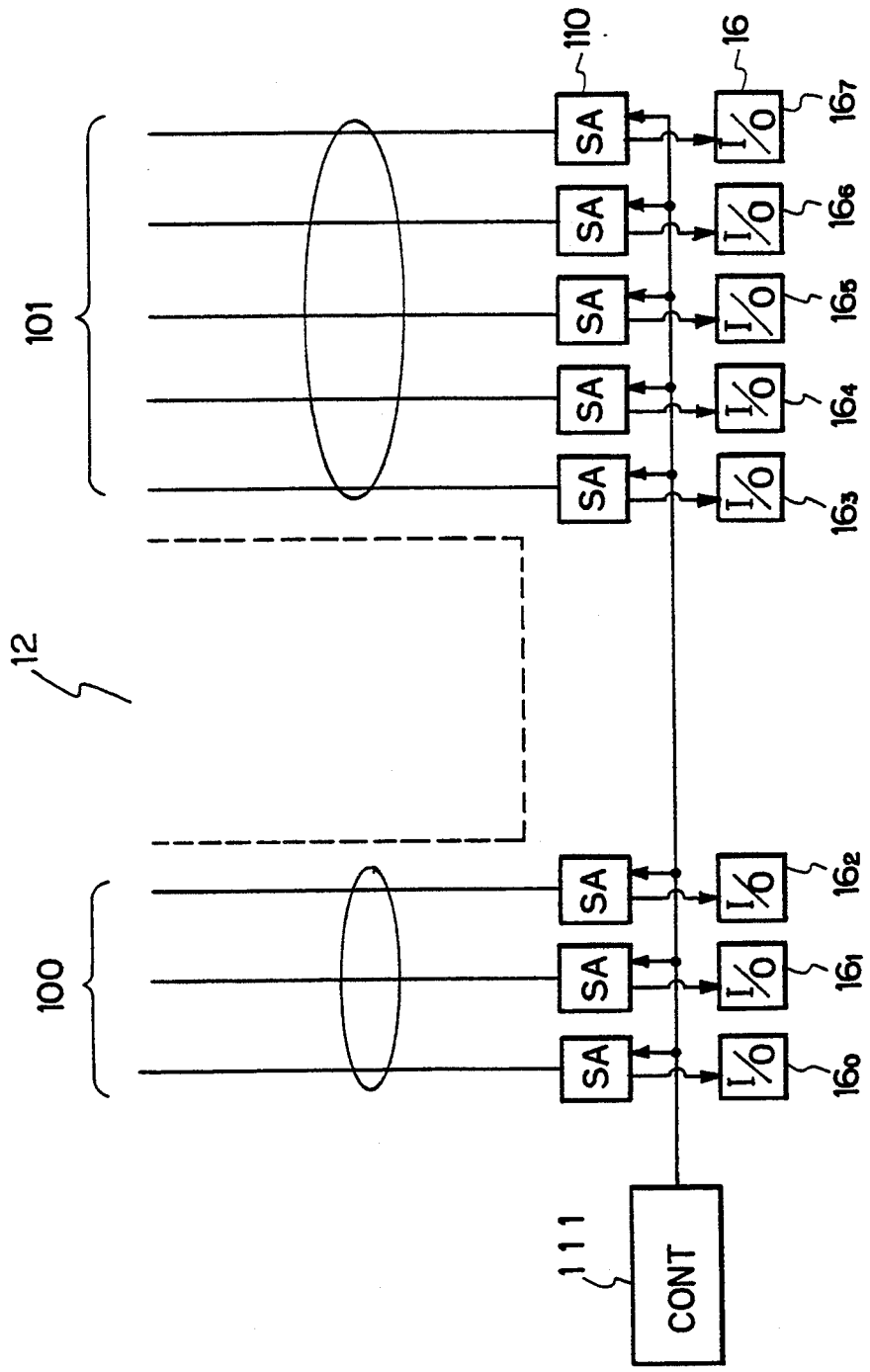
FIG. 8 is a view showing control means for a semiconductor memory according to the invention.

FIG. 8 shows an example of a technique for carrying out such a correct fetching operation. In the figure, each sense amplifier 110 is connected to a corresponding bit line pair and to a corresponding port 16 through predetermined wiring. Control means 111 is disposed to provide a given sense amplifier 110 with a signal which drives and controls the given sense amplifier.

Figure 4:
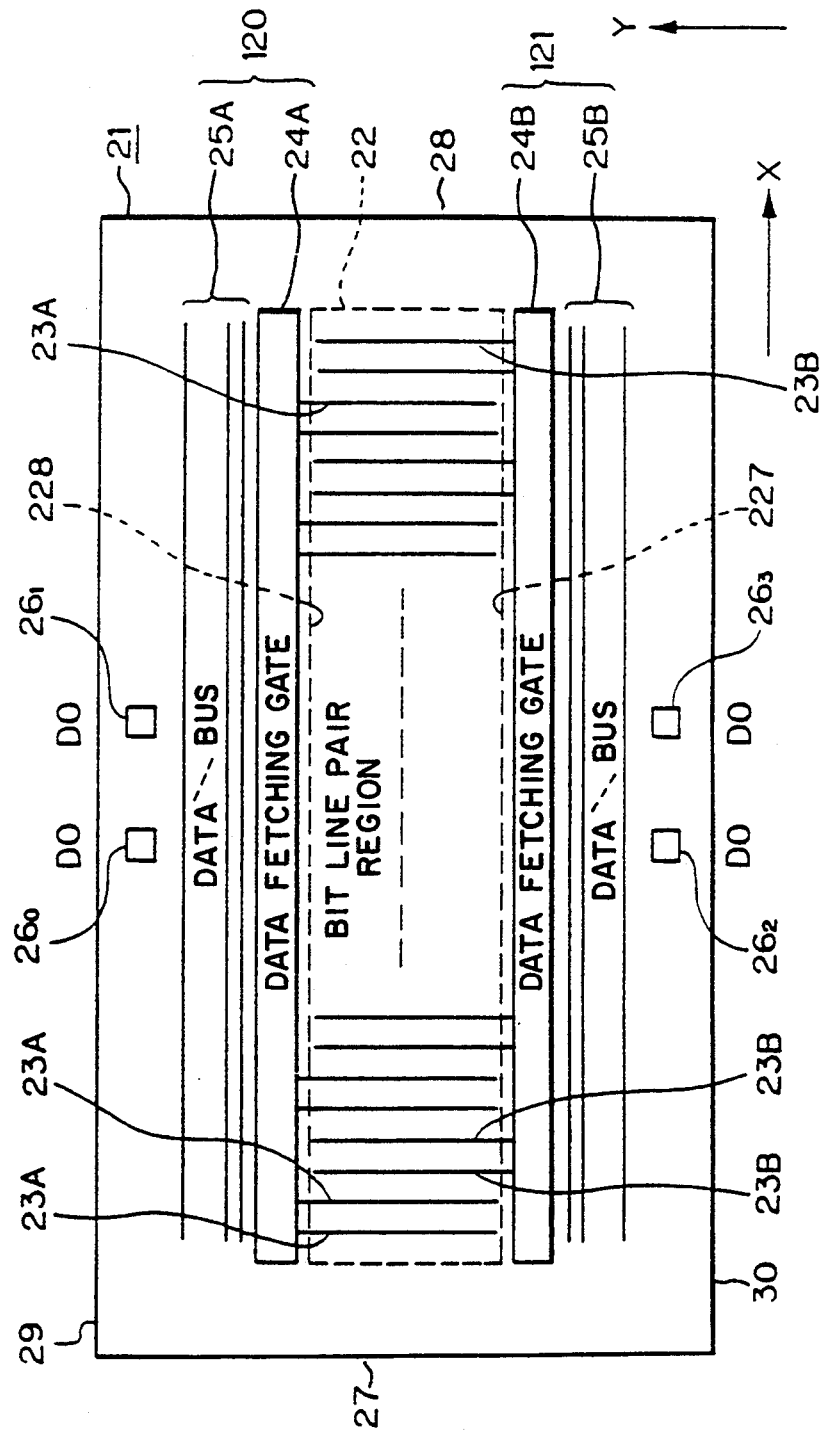
FIG. 4 is a plan view schematically showing a second embodiment of the invention.
Figure 5:
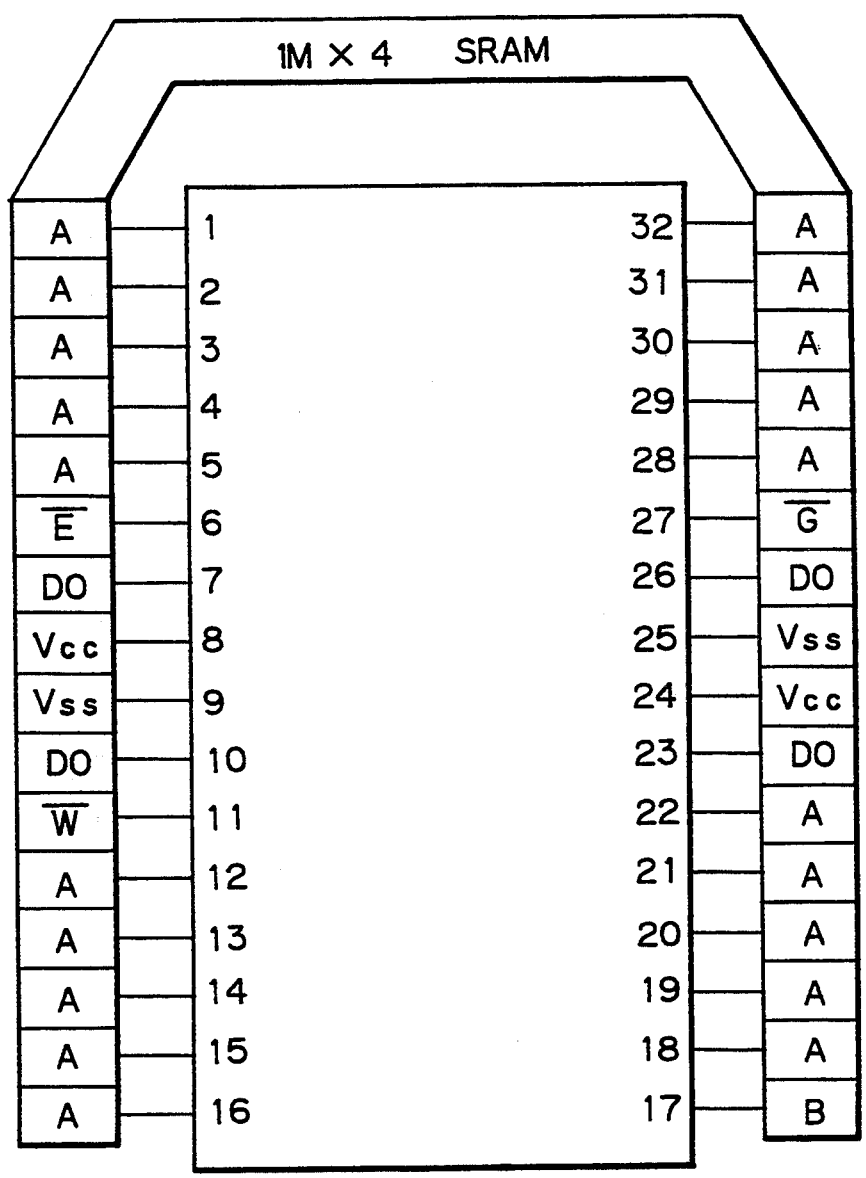
FIG. 5 is a view showing other pin arrangement standards.

FIG. 4 is a plan view schematically showing the second embodiment of the invention. This embodiment is based on the pin arrangement standards of FIG. 5 recently proposed. In FIG. 5, a reference mark A indicates an address and DO indicates data. Other reference marks are the same as those of FIG. 3.

In FIG. 4, numeral 21 denotes a chip proper, 22 a bit line pair region including an array of memory cells, 23A and 23B bit line pairs, 24A and 24B data fetching gates, 25A and 25B data buses, and 260 to 263 output ports. Pads, such as power source pads, are omitted in the figure. Numerals 120 and 121 denote first and second wiring groups, respectively.

The bit line pairs 23A transfer data from the memory cells to the output ports 260 and 261, while the bit line pairs 23B transfer data from the memory cells to the output ports 262 and 263. According to the second embodiment, the bit line pairs 23A and the bit line pairs 23B are alternately arranged.

The data fetching gate 24A and data bus 25A are for the bit line pairs 23A, and the data fetching gate 24B and data bus 25B are for the bit line pairs 23B.

The difference of the second embodiment from the first embodiment is that the ports 260 and 261 selected from the output, input, and input/output ports are located along the wiring group 120 and along a peripheral edge 228 of the bit line pair region 22, while the ports 262 and 263 selected from output, input, and input/output ports are located along the wiring group 121 and along a peripheral edge 227 of the region 22. These edges 227 and 228 are on opposite sides of the bit line pair region 22 and extend in a direction X.

According to the second embodiment, the bit line pairs 23A and 23B extend along short sides 27 and 28 on an element forming plane of the chip 21. The output ports 260 and 261 are arranged substantially at the center of a long side 29 of the chip 21, i.e., the long side 228 of the bit line pair region 22, and the output ports 262 and 263 are arranged substantially at the center of a long side 30 of the chip 21, i.e., the long side 227 of the bit line pair region 22.

The data fetching gate 24A and data bus 25A for the bit line pairs 23A are arranged along the long side 29, for transferring data from the memory cells to the output ports 260 and 261. The data bus 25A for bit line pairs 23A is connected to output circuits (not shown) corresponding to the output ports 260 and 261.

The data fetching gate 24B and data bus 25B for the bit line pairs 23B are arranged along the long side 30, for transferring data from the memory cells to the output ports 262 and 263. The data bus 25B for bit line pairs 23B is connected to output circuits (not shown) corresponding to the output ports 262 and 263.

The second embodiment meets the newly proposed pin arrangement standards of FIG. 5 without elongating the data bus 25A for transferring data to the output ports 260 and 261 and the data bus 25B for transferring data to the output ports 262 and 263, thereby achieving high-speed operation.

Although this embodiment employs two data fetching gates 24A and 24B, they will never cause deterioration of the operation speed because these gates are driven by digital drive circuits that operate at high speed.

Figure 6:
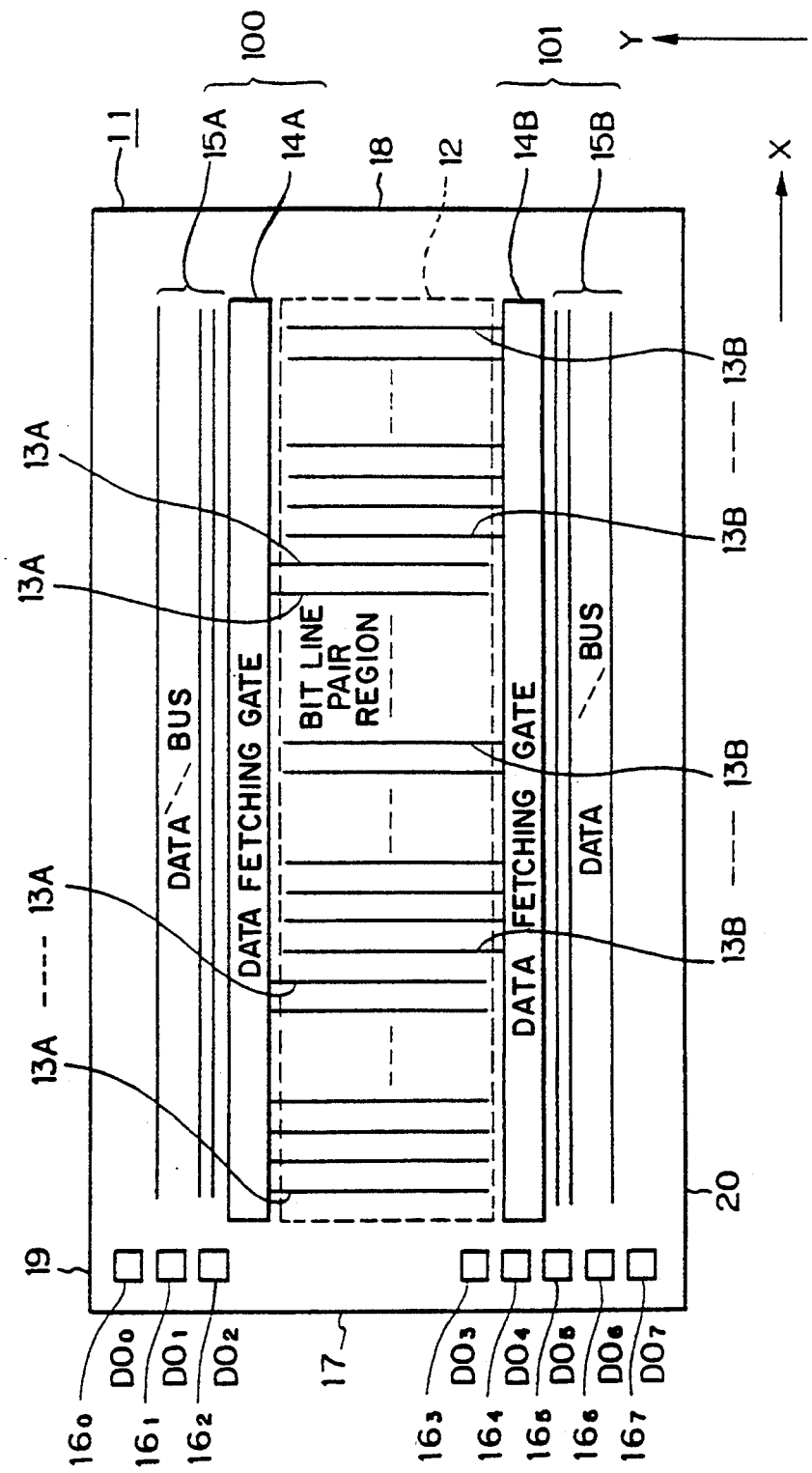
FIG. 6 is a plan view schematically showing a third embodiment of the invention.

FIG. 6 shows the third embodiment of the invention.

According to the first embodiment of FIG. 2, the bit line pairs 13A and 13B are partly alternately arranged so that a ratio of the number of the bit line pairs 13A to the number of the bit line pairs 13B will be 3 to 5.

According to the third embodiment of FIG. 6, an optional number (at least two) of the bit line pairs 13A and 13B are partly alternately arranged, so that a ratio of the number of the bit line pairs 13A to the number of the bit line pairs 13B will be 3 to 5. This embodiment provides the same effect as the first embodiment.

Figure 7:
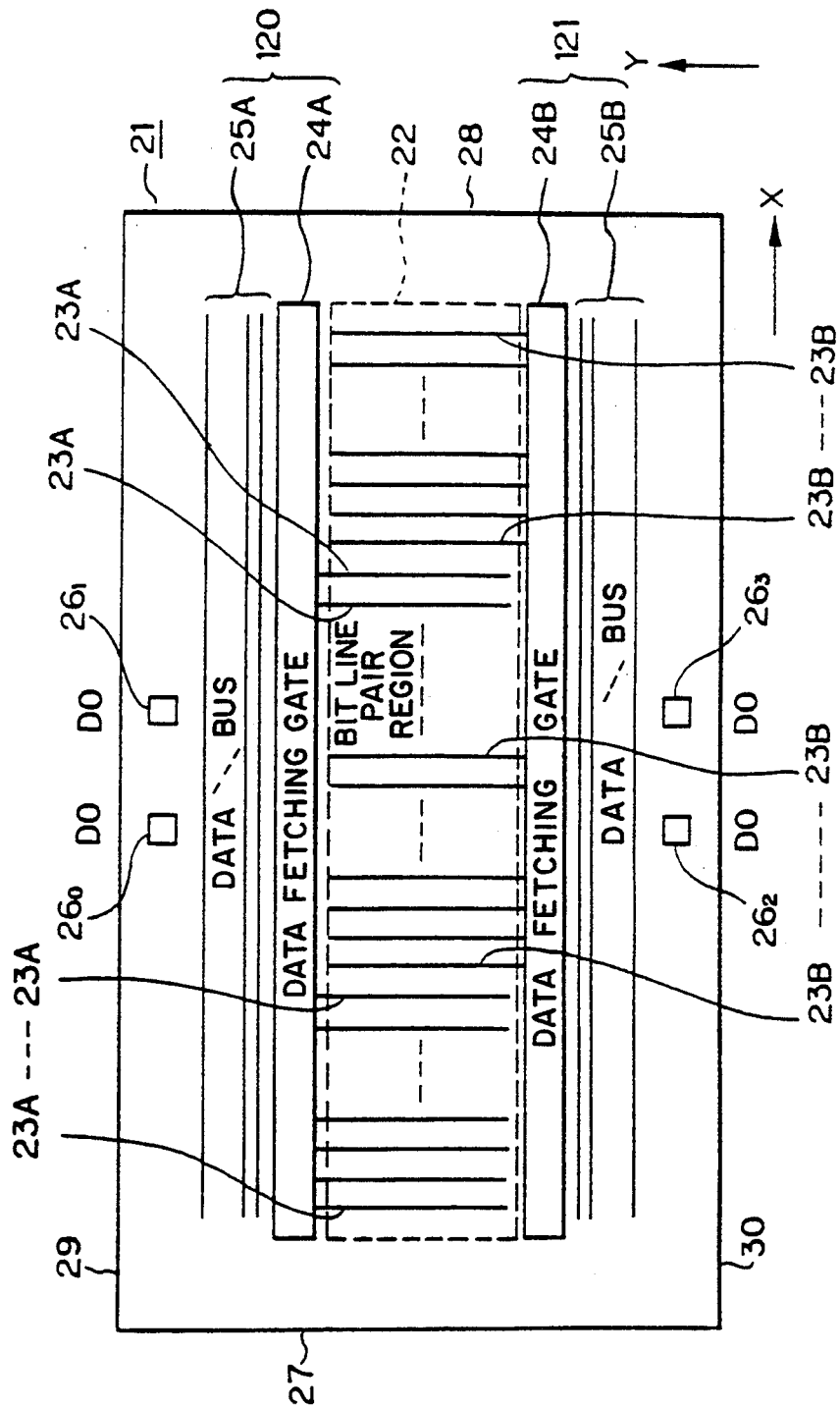
FIG. 7 is a plan view schematically showing a fourth embodiment of the invention.

FIG. 7 is a view showing the fourth embodiment of the invention.

According to the second embodiment of FIG. 4, the bit line pairs 23A and 23B are alternately arranged. According to the fourth embodiment of FIG. 7, an optional number (at least two) of the bit line pairs 23A and 23B are alternately arranged. This embodiment provides the same effect as the second embodiment.

As explained above in detail, the invention provides a semiconductor memory comprising memory cells arranged in rows and columns with the columns of the memory cells being in parallel with a first side of a semiconductor chip on an element forming plane of the chip; bit line pairs disposed in parallel with the first side, and at least one of the output, input, and input/output ports arranged along the first side in the vicinity of each of second and third sides that are orthogonal to the first side of the chip. This arrangement can minimize data buses, thereby improving operation speed.

The invention also provides a semiconductor memory comprising memory cells arranged in rows and columns with the columns of the memory cells being in parallel with a first side of a semiconductor chip on an element forming plane of the chip, bit line pairs disposed in parallel with the first side and at least one of the output, input, and input/output ports arranged substantially at the center of each of second and third sides that are orthogonal to the first side of the chip. This arrangement can minimize data buses, thereby improving operation speed.

I claim:

1. A semiconductor memory device having a semiconductor chip with an element forming plane, said semiconductor chip mounted on a package having a first side and a second side opposite the first side, said semiconductor memory device comprising:

a rectangular bit line pair region having first and second sides, said first side being opposite said second side, and having third and fourth sides orthogonal to said first and second sides, said third side being opposite said fourth side, said bit line pair region comprising:

a plurality of bit line pairs extending in parallel with one another in a first direction on the element forming plane of the semiconductor chip, and a memory cell array formed on the element forming plane;

first and second wiring groups, each comprising a data fetching gate and a data bus, said first and second wiring groups being arranged on said first and second sides of said bit line pair region, respectively, and oriented in a second direction that is orthogonal to the first direction, a number of said plurality of bit line pairs being connected to said first wiring group, and the remaining bit line pairs being connected to said second wiring group; and a first port group comprising at least one port and a second port group comprising at least one port, each port of said first and second port groups being one of an output port, an input port and an input/output port and a same type as each other port, said first and second port groups disposed in vicinities of said first and second wiring groups, respectively;

a first group of lead pins, each lead pin of said first group respectively corresponding to one port of said first port group and arranged on the first side of the package; and a second group of lead pins, each lead pin of said second group respectively corresponding to one port of said second port group and arranged on the second side of the package.

2. The semiconductor memory device according to claim 1, wherein each port of said first and second port groups is located along one of said third and fourth sides of the bit line pair region, said third and fourth sides extending in the first direction.

3. The semiconductor memory device according to claim 1, wherein said first port group and said second port group are located along said first and second sides of said bit line pair region, respectively, said first and second sides of said bit line pair region extending in the second direction.

4. The semiconductor memory device according to claim 2, wherein a first number of said plurality of bit line pairs is connected to said first wiring group and a second number of said plurality of bit line pairs is connected to said second wiring group, a total number of the ports of the first port group, disposed in the vicinity of the first wiring group, and a total number of the ports of the second port group, disposed in the vicinity of the second wiring group, are determined based upon a ratio of said first number of said plurality of bit line pairs to said second number of said plurality of bit line pairs.

5. The semiconductor memory device according to claim 2, wherein the ports of said first port group, disposed in the vicinity of the first wiring group, are spaced apart from the ports of the second port group, disposed in the vicinity of the second wiring group, by a distance of at least a half of a length of one of said plurality of bit line pairs disposed in said bit line pair region.

6. A semiconductor memory according to claim 1, wherein the semiconductor memory device is a static random access memory comprising flip-flop memory cells.

7. A semiconductor memory device having a memory cell array arranged in rows and columns, a rectangular semiconductor chip having first through fourth chip sides and mounted on a package having a first package side and a second package side opposing the first package side, with the columns of the memory cell array being in parallel with the first chip side of the semiconductor chip on an element forming plane of the semiconductor chip, a plurality of bit line pairs disposed in parallel with the first chip side, and a first port group comprising at least one port and a second port group comprising at least one port, each of the ports of the first and second port groups being one of an output port, an input port, and an input/output port, each port of the first port group arranged along the first chip side in a vicinity of the second chip side that is orthogonal to the first chip side, each port of the second port group arranged along the first chip side in a vicinity of the third chip side that is orthogonal to the first chip side and opposite the second chip side, said semiconductor memory device comprising:

a first data fetching gate and a first data bus disposed along the second chip side, transferring data from first ones of the plurality of bit line pairs to corresponding ports of the first port group; and a second data fetching gate and a second data bus disposed along the third chip side, transferring data from second ones of the plurality of bit line pairs to corresponding ports of the second port group, each port of the second port group being a same type as each port of the first port group; and lead pins corresponding to respective ports of the first port group arranged on said first package side, and lead pins corresponding to respective ports of the second port group arranged on said second package side.

8. A semiconductor memory device having a memory cell array arranged in rows and columns, a rectangular semiconductor chip having first through fourth chip sides and mounted on a package having a first package side and a second package side opposite said first package side, with the columns of the memory cell array being in parallel with the first chip side of the semiconductor chip on an element forming plane of the semiconductor chip, a plurality of bit line pairs disposed in parallel with the first chip side, and a first port group comprising at least one port and a second port group comprising at least one port, each of the ports of the first and second port groups being one of an output port, an input port, and an input/output port, each port of the first port group arranged substantially at the center of the second chip side that is orthogonal to the first chip side and each port of the second port group arranged substantially at the center of the third chip side that is orthogonal to the first chip side and opposite the second chip side, said semiconductor memory device comprising:

a first data fetching gate and a first data bus disposed along the second chip side, transferring data from first ones of the plurality of bit line pairs to corresponding ports of the first port group; and a second data fetching gate and a second data bus disposed along the third chip side, transferring data from second ones of the plurality of bit line pairs to corresponding ports of the second port group, each port of the second port group being a same type as each port of the first port group; and lead pins corresponding to respective ports of the first port group arranged on said first package side, and lead pins corresponding to respective ports of the second port group arranged on said second package side.

9. A semiconductor device having a semiconductor chip with an element forming plane, said semiconductor chip mounted on a package having a first package side and a second package side opposite the first package side, said semiconductor memory device comprising:

a rectangular bit line pair region having a periphery and comprising:

a plurality of bit line pairs disposed in parallel with one another in a first direction on the element forming plane of the semiconductor chip, and a memory cell array formed on the element forming plane;

a first port group comprising at least one port and a second port group comprising at least one port, each port of said first and second port groups being one of an output port, an input port, and an input/output port and being of the same type as each other port, said first and second port groups located at respective separate first and second peripheral positions adjacent to said periphery of said bit line pair region;

first and second wiring groups, each comprising a data fetching gate and a data bus, disposed in vicinities of the first and second peripheral positions, respectively, said first and second wiring groups being oriented in a second direction that is orthogonal to the first direction, a first number of said plurality of bit line pairs being connected to said first wiring group and a second number of said plurality of bit line pairs being connected to said second wiring group, a total number of the ports of the first port group, disposed in a vicinity of the first wiring group, and a total number of the ports of the second port group, disposed in a vicinity of the second wiring group, being determined based upon a ratio of said first number of said plurality of bit line pairs to said second number of said plurality of bit line pairs;

a first group of lead pins, each lead pin of said first group respectively corresponding to one port of said first port group and arranged on the first side of the package; and a second group of lead pins, each lead pin of said second group respectively corresponding to one port of said second port group and arranged on the second side of the package.

10. The semiconductor memory device according to claim 1, wherein the semiconductor memory device is a static random access memory comprising flip-flop memory cells.

11. The semiconductor memory device according to claim 2, wherein the semiconductor memory device is a static random access memory comprising flip-flop memory cells.

12. The semiconductor memory device according to claim 3, wherein the semiconductor memory device is a static random access memory comprising flip-flop memory cells.

13. The semiconductor memory device according to claim 4, wherein the semiconductor memory device is a static random access memory comprising flip-flop memory cells.

14. The semiconductor memory device according to claim 9, wherein the semiconductor memory device is a static random access memory comprising flip-flop memory cells.

15. The semiconductor memory device according to claim 5, wherein the semiconductor memory device is a static random access memory comprising flip-flop memory cells.

* * * * *